US012123089B2

(12) United States Patent
Duan et al.

(10) Patent No.: US 12,123,089 B2
(45) Date of Patent: Oct. 22, 2024

(54) METHOD AND APPARATUS FOR FORMING A PLASMA RESISTANT COATING, COMPONENT, AND PLASMA PROCESSING APPARATUS

(71) Applicant: ADVANCED MICRO-FABRICATION EQUIPMENT INC. CHINA, Shanghai (CN)

(72) Inventors: Jiao Duan, Shanghai (CN); Sheng Guo, Shanghai (CN); Xiang Sun, Shanghai (CN); Xingjian Chen, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 488 days.

(21) Appl. No.: 17/108,666

(22) Filed: Dec. 1, 2020

(65) Prior Publication Data

US 2021/0172049 A1 Jun. 10, 2021

(30) Foreign Application Priority Data

Dec. 4, 2019 (CN) .......................... 201911227763.9

(51) Int. Cl.
*C23C 14/08* (2006.01)
*C23C 14/06* (2006.01)
(Continued)

(52) U.S. Cl.
CPC ........ *C23C 14/083* (2013.01); *C23C 14/0694* (2013.01); *C23C 14/26* (2013.01);
(Continued)

(58) Field of Classification Search
USPC ........................ 118/308, 309, 303, 723 R, 50
See application file for complete search history.

(56) References Cited

U.S. PATENT DOCUMENTS 6,641,941 B2 11/2003 Yamada et al.
7,132,621 B2 11/2006 Kumar et al.
(Continued)

FOREIGN PATENT DOCUMENTS

CN 100505975 C 6/2009
CN 105648386 A 6/2016
(Continued)

*Primary Examiner* — Yewebdar T Tadesse
(74) *Attorney, Agent, or Firm* — Womble Bond Dickinson (US) LLP; Joseph Bach, Esq.

(57) ABSTRACT

Disclosed are a method of forming a plasma coating on a component, an apparatus for forming the coating, a component, and a processing apparatus; the apparatus for forming the coating includes: a vacuum chamber; a first coating material source, a second coating material source, and a component, which are disposed in the vacuum chamber; wherein the first coating material source includes oxygen atoms and yttrium atoms, and the second coating material source includes one of yttrium fluoride, aluminum-oxygen compound, or zirconium-oxygen compound; a first exciting device configured for exciting out the yttrium atoms and oxygen atoms from within the first coating material source; a second exciting device configured for exciting out atoms from within the second coating material source; wherein collision of the yttrium atoms and oxygen atoms excited out of the first coating material source and the atoms excited out of the second coating material source produces a chemical reaction to form on the component a plasma resistant coating including a stable phase of yttrium-based multi-element metal oxide or yttrium-based oxyfluoride. The coating formed using the apparatus has a strong plasma corrosion resistance property.

7 Claims, 4 Drawing Sheets

(51) Int. Cl.
*C23C 14/26* (2006.01)
*C23C 14/30* (2006.01)
*C23C 14/46* (2006.01)
*C23C 28/04* (2006.01)

(52) U.S. Cl.
CPC ............ *C23C 14/30* (2013.01); *C23C 14/46* (2013.01); *C23C 28/042* (2013.01)

(56) References Cited

U.S. PATENT DOCUMENTS

| | | | |
|---|---|---|---|
| 10,443,125 B2 | 10/2019 | Wu et al. | |
| 10,443,126 B1 | 10/2019 | Wu et al. | |
| 11,572,617 B2 | 2/2023 | Fenwick et al. | |
| 2009/0121989 A1* | 5/2009 | Namose | B82Y 20/00 345/85 |
| 2012/0228601 A1* | 9/2012 | Hiyama | G02B 5/0231 257/E51.026 |
| 2019/0027343 A1* | 1/2019 | Nitta | H01L 21/3065 |
| 2019/0131113 A1 | 5/2019 | Fenwick et al. | |
| 2021/0111044 A1* | 4/2021 | Kim | C23C 28/042 |

FOREIGN PATENT DOCUMENTS

| | | | | |
|---|---|---|---|---|
| EP | 0334374 A2 * | 9/1980 | ............ | H01L 39/24 |
| EP | 0431160 A1 * | 3/1989 | ............ | C01B 13/14 |
| JP | H07228866 A | 8/1995 | | |
| JP | 2003095649 A | 4/2003 | | |
| JP | 2019515139 A | 6/2019 | | |
| JP | 2019143188 A | 8/2019 | | |
| JP | 2019183278 A | 10/2019 | | |
| KR | 20180123992 A | 11/2018 | | |
| TW | 201807223 A | 3/2018 | | |
| TW | 201931513 A | 8/2019 | | |

* cited by examiner

METHOD AND APPARATUS FOR FORMING A PLASMA RESISTANT COATING, COMPONENT, AND PLASMA PROCESSING APPARATUS

RELATED APPLICATION

The present application claims priority to and the benefit of Chinese Patent Application No. 201911227763.9, filed on Dec. 4, 2019, and the disclosure of which is hereby incorporated by reference in its entirety.

TECHNICAL FIELD

Embodiments of the present disclosure relate to the field of semiconductor, and more particularly relate to a method and a corresponding apparatus for forming a plasma resistant coating on a component, and a component and a plasma processing apparatus with the plasma resistant coating

BACKGROUND

A plasma etching process plays a crucial role in the integrated circuit industry. For a component under a severe corrosive environment inside a plasma etching chamber, it needs to have a strong resistance against plasma corrosion. To address this need, patents have been proposed to apply a plasma resistant coating such as yttrium oxide or yttrium fluoride on surfaces of parts inside the plasma etching chamber so as to protect relevant workpieces, which has produced a good plasma corrosion resistance effect. However, with continuous development of advanced semiconductor manufacturing processes (10 nm and below), the percentage of F/O plasmas used in the plasma etching process also increases, and the etching property of plasma is constantly strengthened, which requires those parts in contact with plasma: 1. to have a higher surface compactness and a property of resistance to $CF_4$ and/or $O_2$ plasma corrosions but better not to change the material structure so as to maintain stability of the etching environment inside the chamber; 2. to have a shorter surface initiation time and a longer service life so as to lower chamber maintenance cost.

However, yttrium oxide and yttrium fluoride only provide limited protection, such that they cannot further satisfy actual requirements. Therefore, to further improve the etching property of plasma, a plasma resistant coating material is desired, which is capable of resisting $CF_4$ and $O_2$ plasma corrosion, has a long service life and a high surface compactness, and can maintain stability of the etching environment inside the cavity.

SUMMARY OF THE INVENTION

The technical problem to be solved by the present disclosure is to provide a method of forming a plasma resistant coating on a component, an apparatus for forming a plasma resistant coating on a component, a component, and a plasma processing apparatus, so as to mitigate plasma corrosion with respect to the plasma resistant coating and improve stability of the plasma etching environment.

To solve the technical problem, the present disclosure provides an apparatus for forming a plasma resistant coating on a component, comprising: a vacuum chamber; a first coating material source, a second coating material source, and a component, which are disposed in the vacuum chamber; wherein the first coating material source includes oxygen atoms and yttrium atoms, and the second coating material source includes one of yttrium fluoride, aluminum-oxygen compound, or zirconium-oxygen compound; the component is disposed opposite to the first coating material source and the second coating material source; a first exciting device configured for exciting out the yttrium atoms and oxygen atoms from within the first coating material source; a second exciting device configured for exciting out atoms from within the second coating material source; wherein collision between the yttrium atoms and oxygen atoms excited out of the first coating material source and the atoms excited out of the second coating material source produces chemical reaction to deposit a plasma resistant coating on the component, the plasma resistant coating including a stable phase of yttrium-based multi-element metal oxide or yttrium-based oxyfluoride.

Optionally, the first coating material source is $Y_2O_3$, $Y(OH)_3$, or a compound whose decomposed product under high temperature is $Y_2O_3$.

Optionally, the yttrium fluoride is $YF_3$, $Y(CO_3)F$, or a compound whose decomposed product under high temperature is $YF_3$, wherein the yttrium-based oxyfluoride included in the plasma resistant coating is yttrium oxyfluoride; and the stable phase of yttrium oxyfluoride includes at least one of YOF, $Y_5O_4F_7$, $Y_6O_5F_8$, $Y_7O_6F_9$ or $Y_{17}O_{14}F_{23}$.

Optionally, the aluminum-oxygen compound includes aluminum oxide, aluminum hydroxide, boehmite or pseudo bochite, the yttrium-based multi-element metal oxide included in the plasma resistant coating is yttrium aluminum oxide, and the yttrium aluminum oxide includes $Y_3Al_5O_{12}$, $YAlO_3$ or $Y_4Al_2O_9$.

Optionally, the zirconium-oxygen compound includes zirconium oxide or zirconium hydroxide, and the yttrium-based multi-element metal oxide included in the plasma resistant coating is yttrium zirconium oxide, the yttrium zirconium oxide including $Zr_aY_{1-a}O_2$ ($0.5<a<1$).

Optionally, the second coating material source is an aluminum-oxygen compound or a zirconium-oxygen compound; the apparatus for forming a plasma resistant coating further comprises: a third coating material source, the third coating material source including a fluorine-contained compound, an aluminum-oxygen compound or a zirconium-oxygen compound, the material of the third coating material source being different from that of the second coating material source; and a third exciting device configured for exciting atoms out from within the third coating material source, wherein the plasma resistant coating formed by chemical reaction between the yttrium atoms and oxygen atoms excited out from within the first coating material source and the atoms excited out from within the second coating material source and the third coating material source is an yttrium-based oxyfluoride or yttrium-based multi-element metal oxide, the yttrium-based oxyfluoride including an yttrium aluminum fluoride oxide or yttrium zirconium fluoride oxide, and the yttrium-based multi-element metal oxide including an yttrium aluminum zirconium oxide.

Optionally, the first exciting device, the second exciting device, or the third exciting device is a plasma bombardment device, the plasma generated by the plasma bombardment device including at least one of argon plasma and oxygen plasma.

Optionally, the first exciting device, the second exciting device, or the third exciting device is at least one of an electronic gun heater, a resistance heater, a laser heater, and a radio-frequency induction heater.

Optionally, the plasma resistant coating only includes a stable phase of yttrium-based multi-element metal oxide or yttrium-based oxyfluoride.

Optionally, the plasma resistant coating further includes: a metal oxide and/or a metal fluoride.

The present disclosure provides a method of forming a plasma resistant coating on a component, comprising: providing the apparatus for forming a plasma resistant coating on a component; performing, by the first exciting device, a first excitation process to a first coating material source such that the yttrium atoms and oxygen atoms in the first coating material source are excited out, and meanwhile performing, by the second exciting device, a second excitation process to the second coating material source such that the atoms in the second coating material source are excited out; producing a chemical reaction by collision between the yttrium atoms and oxygen atoms excited out from within the first coating material source and the atoms excited out from within the second coating material source to deposit a plasma resistant coating on the component, the plasma resistant coating including a stable phase of yttrium-based multi-element metal oxide or yttrium-based oxyfluoride.

Optionally, the first excitation process and the second excitation process refer to one of an ion sputtering process and a high-temperature evaporation process, respectively.

Optionally, in the case that the first excitation process and/or the second excitation process is the ion sputtering process, the first exciting device and/or the second exciting device is a plasma bombardment device, the plasma generated by the plasma bombardment device including at least one of argon plasma and oxygen plasma.

Optionally, in the case that both the first excitation process and/or the second excitation process is the high-temperature evaporation process, the first exciting device and/or the second exciting device refer to at least one of an electronic gun heater, a resistance wire heater, a laser heater, and a radio-frequency induction heater.

Optionally, both the first excitation process and the second excitation process are the ion sputtering process; parameters of the first excitation process include: plasma being argon plasma, and bombardment energy 5 kW~20 kW; parameters of the second excitation process include: plasma being argon plasma, and bombardment energy 5 kW~20 kW.

Optionally, both the first excitation process and the second excitation process are the high-temperature evaporation process; parameters of the first excitation process include: temperature higher than 2400° C.; parameters of the second excitation process include: temperature higher than 1400° C.

Optionally, the method further comprises: heating the component, causing collision among yttrium atoms, oxygen atoms, and metal atoms, or among the yttrium atoms, oxygen atoms, metal atoms, and fluorine atoms, to react chemically and deposit a stable-phase of yttrium-based multi-element metal oxide or yttrium-based oxyfluoride on the component.

Optionally, the temperature for heating the component ranges from 25° C. to 500° C.

Correspondingly, the present disclosure further provides a component, comprising: a component body, and a plasma resistant coating on the component body, wherein the plasma resistant coating includes a stable phase of yttrium-based multi-element metal oxide or yttrium-based oxyfluoride.

Correspondingly, the present disclosure further provides a plasma processing apparatus including a component, comprising: a reaction chamber inside which is a plasma environment; the component disposed in the reaction chamber and having a plasma resistant coating, wherein the plasma resistant coating includes a stable phase of yttrium-based multi-element metal oxide or yttrium-based oxyfluoride, the plasma resistant coating being exposed to the plasma environment.

Optionally, in the case that the plasma processing apparatus is an inductively coupled plasma processing apparatus, the component including: at least one of a window, a liner, a nozzle, a gas box, a gas flange, an electrostatic assembly, a cover ring, a focus ring, an insert ring, and a substrate holding fixture.

Optionally, in the case that the plasma processing apparatus is a capacitively coupled plasma processing apparatus, the component comprises: at least one of a showerhead, an upper ground ring, a moving ring, a gas box, a mountain base, an electrostatic chuck assembly, a lower ground ring, a cover ring, a focus ring, an insert ring, and a substrate holding fixture.

Compared with conventional technologies, technical solutions in the embodiments of the present disclosure offer the following beneficial effects:

According to the method of forming a plasma resistant coating on a component provided by the present disclosure, the first excitation process to the first coating material is performed by the first exciting device, such that the yttrium atoms and the oxygen atoms in the first coating material source are excited out, and meanwhile a second excitation process to the second coating material is performed by the second exciting device, such that the atoms in the second coating material source are excited out; wherein collision between the yttrium atoms and oxygen atoms excited out from within the first coating material source and the atoms excited out from within the second coating material source produces a chemical reaction to deposit a plasma resistant coating on the component, the plasma resistant coating including a stable phase of yttrium-based multi-element metal oxide or yttrium-based oxyfluoride. When the component is exposed to an oxygen-contained and/or fluorine-contained plasma environment, because the yttrium-based multi-element metal oxide or yttrium-based oxyfluoride has a stable phase structure, the yttrium-based multi-element metal oxide or yttrium-based oxyfluoride can prevent adsorption and diffusion of the oxygen and fluorine on the plasma coating surface and further corrosion to the plasma coating surface, which, on one hand, facilitates reduction of the odds of corroding the plasma resistant coating, and on the other hand, facilitates shortening the time for the plasma to reach saturation in the plasma environment and maintaining stability of the oxygen and fluorine plasma environment in the cavity.

DETAILED DESCRIPTION OF EMBODIMENTS

Figure 1:
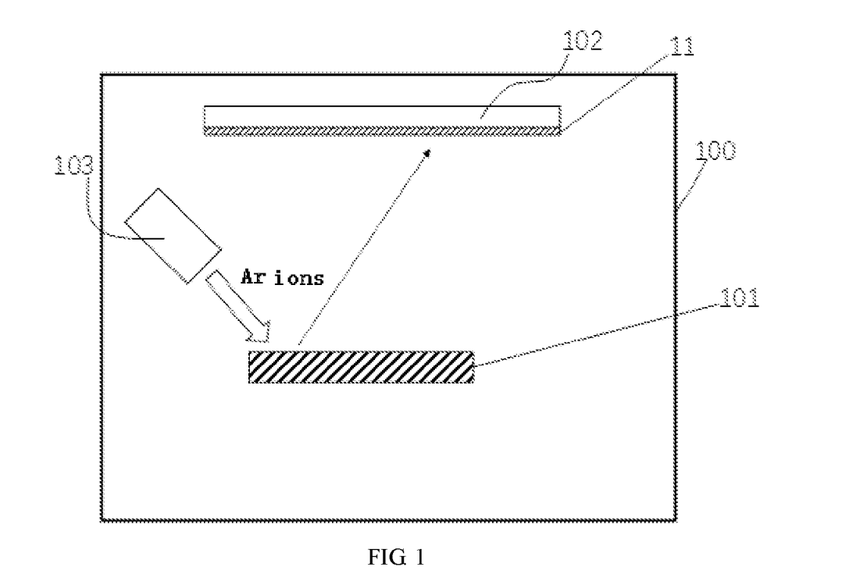
FIG. 1 shows a schematic diagram of an apparatus for forming a plasma resistant coating on a component using an ion sputtering process.

As discussed in the Background, yttrium oxide and yttrium fluoride are limited in component protection and cannot satisfy actual requirements, particularly cannot resist plasma corrosion such as $CF_4$ and $O_2$ simultaneously. To this end, the present disclosure aims to provide a plasma resistance coating which can resist plasma corrosion, as will be elaborated below:

FIG. 1 shows a schematic diagram of an apparatus for forming a plasma resistant coating on a component using an ion sputtering process.

FIG. 1 illustrates a vacuum chamber 100; an $Y_xO_yF_z$ target material 101 and a component 102, which are oppositely disposed in the vacuum cavity 100; a plasma bombardment device 103 disposed in the vacuum chamber 100, configured for bombarding the $Y_xO_yF_z$ target material 101 to generate yttrium atoms, oxygen atoms, and fluorine atoms, where the resultant yttrium atoms, oxygen atoms, and fluorine atoms are deposited on the surface of the $Y_xO_yF_z$ target material 101 to form a plasma resistant coating 11.

By bombarding the surface of the $Y_xO_yF_z$ target material 101 using the argon plasma in the plasma bombardment device 103 in the apparatus, the yttrium atoms, oxygen atoms, and fluorine atoms in the $Y_xO_yF_z$ target material 101 are bombarded out, wherein the bombarded-out yttrium atoms, oxygen atoms, and fluorine atoms are deposited on the surface of $Y_xO_yF_z$ target material 101 to form the plasma resistant coating 11.

Theoretically, the constituents and phase of the plasma resistant coating 11 shall agree with the $Y_xO_yF_z$ target material 101. However, in practice, the inventors found that during excitation, $Y_xO_yF_z$ (under about 1000° C.) will be decomposed into two phases: $Y_2O_3$ and $YF_3$. Moreover, the melting point of $YF_3$ (1387° C.) is far less than $Y_2O_3$ (melting point 2410° C.), such that when the yttrium atoms and fluorine atoms in $YF_3$ are excited out, the yttrium atoms and oxygen atoms in $Y_2O_3$ are not excited out. When $Y_xO_yF_z$ is consumed partially, those skilled in the art would normally believe that the formed plasma resistant coating 11 is YOF; however, in actuality, the plasma resistant coating 11 can only be $YF_3$. When a component with $YF_3$ plasma resistant coating 11 is applied in a plasma environment, $YF_3$ easily absorbs the oxygen in the plasma environment; besides, it takes a relatively long time to consume a considerable amount of oxygen plasma to cause the plasma resistant coating surface to reach saturation, which significantly increases operation costs of the plasma processing apparatus. Additionally, because $YF_3$ adsorbs the oxygen in the plasma environment, the stability of the plasma environment becomes deteriorated.

Figure 2:
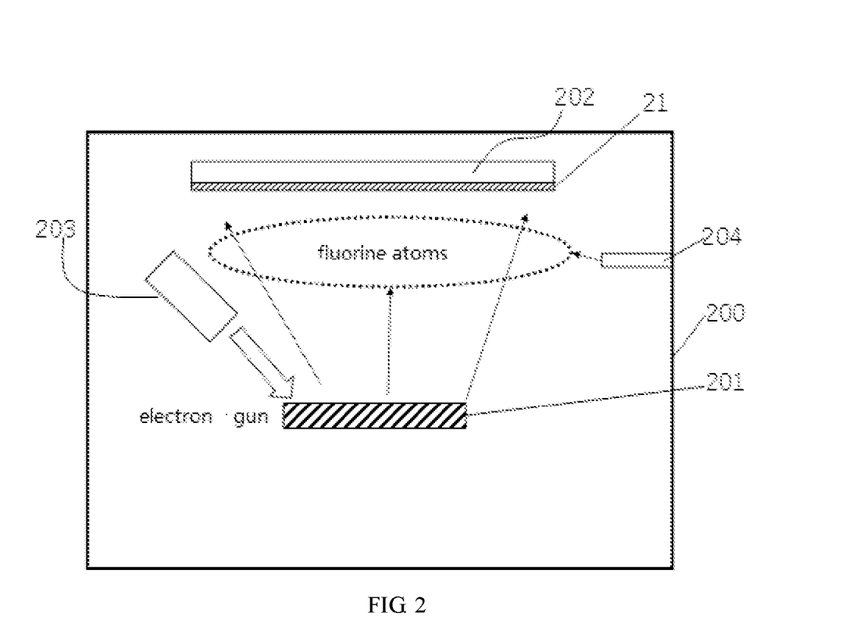
FIG. 2 shows a schematic diagram of another apparatus for forming a plasma resistant coating on a component using a high temperature evaporation process.

FIG. 2 shows a schematic diagram of another apparatus for high-temperature evaporation to form a plasma resistant coating on a component using a high temperature evaporation process.

FIG. 2 illustrates a vacuum chamber 200; an $y_2O_3$ source 201 disposed in the vacuum chamber 200; a fluorine source supply part 204 configured for supplying fluorine atoms into the vacuum cavity 200; a component 202 disposed opposite to the $Y_2O_3$ source 201; an electronic gun 203 disposed in the vacuum chamber 200, configured for heating the $Y_2O_3$ source 201, causing the yttrium atoms and oxygen atoms in the $Y_2O_3$ source 201 to be excited out, where the yttrium atoms, oxygen atoms, and fluorine atoms form a plasma resistant coating 21 on the surface of the component 202.

During the course of forming a plasma coating on the surface of the component 202 through a high-temperature evaporation process, the inventors found that: because the energy of ionized F atoms is relatively low and its collision with $Y_2O_3$ atoms and molecules does not suffice to produce a chemical reaction, a major part of the plasma resistant coating 21 is actually still an $y_2O_3$ film, and only a few fluorine atoms (about 8 Atom %) are physically adsorbed on the surface of the $Y_2O_3$ film, failing to form a stable phase of YOF. When the component including the plasma resistant coating 21 is applied in a plasma environment, the $Y_2O_3$ film is easily corroded by the absorbed fluorine plasma; moreover, it takes a relatively long time to consume a considerable amount of fluorine-contained plasma to cause the plasma resistant coating surface to reach saturation, which significantly increases operation costs of the plasma processing apparatus. Additionally, $Y_2O_3$ film adsorbs the fluorine plasma in the plasma environment, which causes change to the fluorine in the plasma environment, i.e., the stability of the plasma environment becomes deteriorated.

In view of the above, it is impossible to form, using the conventional apparatuses discussed above, a plasma resistant coating including a stable phase of yttrium oxyfluoride on the component; when the above-mentioned plasma resistant coating is applied to the plasma environment, it easily absorbs the oxygen or fluorine in the plasma; therefore, the plasma resistant coating fails to satisfy all requirements including plasma corrosion resistance against fluorine and oxygen, reduction of the operation time for the plasma environment in the plasma processing apparatus to reach stability, or improved stability of the etching cavity environment.

To solve the technical problems above, the technical solution of the present disclosure provides an apparatus for forming a plasma resistant coating on a component, comprising: a vacuum chamber; a first coating material source, a second coating material source, and a component, which are disposed in the vacuum chamber; wherein the first coating material source includes oxygen atoms and yttrium atoms, and the second coating material source includes metal atoms, the second coating material further including one of oxygen atoms and fluorine atoms; the component is disposed opposite to the first coating material source and the second coating material source; a first exciting device configured for exciting out the yttrium atoms and oxygen atoms from within the first coating material source; a second exciting device configured for exciting out atoms from within the second coating material source; collision between the yttrium atoms and oxygen atoms excited out of the first coating material source and the atoms excited out of the second coating material source to produce a chemical reaction to deposit a plasma resistant coating on the component, the plasma resistant coating including a stable phase of yttrium-based multi-element metal oxide or yttrium-based oxyfluoride. Application of the plasma resistant coating formed by the apparatus in the plasma environment facilitates mitigating plasma corrosion to the plasma resistant coating and enhances stability of the etching cavity environment.

To make the above objectives, features, and beneficial effects of the present disclosure more apparent and comprehensible, preferred embodiments of the present disclosure will be described in detail with reference to the accompanying drawings.

Figure 3:
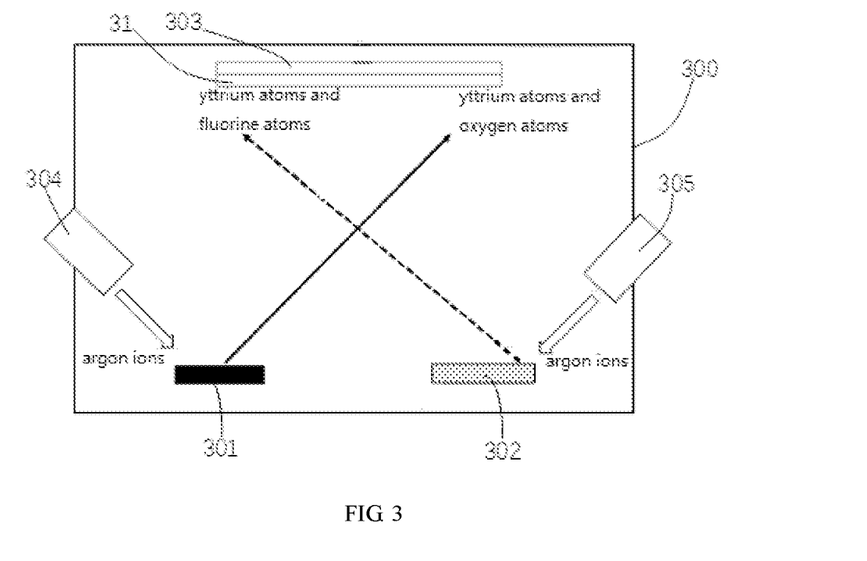
FIG. 3 shows a schematic diagram of an apparatus for forming a plasma resistant coating on a component according to the present disclosure.

FIG. 3 shows a schematic diagram of an apparatus for forming a plasma resistant coating on a component according to the present disclosure.

FIG. 3 illustrates a vacuum chamber 300; a first coating material source 301, a second coating material source 302, and a component 303, which are disposed in the vacuum chamber 300; wherein the first coating material source 301 includes oxygen atoms and yttrium atoms, and the second coating material source 302 includes one of yttrium fluoride, aluminum-oxygen compound, or zirconium-oxygen compound; the component 303 is disposed opposite to the first coating material source 301 and the second coating material source 302; a first exciting device 304 configured for exciting out the yttrium atoms and oxygen atoms from within the first coating material source 301; a second exciting device 305 configured for exciting out atoms from within the second coating material source 302; wherein collision between the yttrium atoms and oxygen atoms excited out of the first coating material source 301 and the atoms excited out of the second coating material source produces a chemical reaction to deposit a plasma resistant coating 31 on the surface of the component 303, the plasma resistant coating 31 including a stable phase of yttrium-based multi-element metal oxide or yttrium-based oxyfluoride.

In this embodiment, in the case that the stable phase of yttrium-based oxyfluoride is yttrium oxyfluoride, the first coating material source 301 includes oxygen atoms and yttrium atoms, and the second coating material source 302 is yttrium fluoride. Significance of such configuration lies in that: as the first coating material source 301 includes oxygen atoms and yttrium atoms, the first coating material source 301 has a relatively large mass; in the case that the second coating material source 302 is a compound including fluorine atoms and yttrium atoms, on one hand, it will not introduce a contamination source; on the other hand, the mass of the second coating material source 302 is equivalent to the mass of the first coating material source 301; then, when the yttrium atoms and oxygen atoms in the first coating material source 301 collide with the fluorine atoms and yttrium atoms, neither the fluorine atoms and yttrium atoms nor the yttrium atoms and oxygen atoms would be bounced back, which facilitates chemical reaction of the yttrium atoms and oxygen atoms with the fluorine atoms and yttrium atoms, thereby facilitating formation of a stable phase of oxyfluoride.

In this embodiment, the material of the first coating material source 301 is $Y_2O_3$, and the material of the second coating material source 302 is $YF_3$.

In other embodiments, the material of the first coating material source includes: $Y(OH)_3$ or a compound whose decomposed product is $Y_2O_3$ under high temperature; the second coating material source includes: $Y(CO_3)F$ or a compound whose decomposed product is $YF_3$ under high temperature.

In this embodiment, both the first exciting device 304 and the second exciting device 305 are plasma bombardment devices, and the plasma generated by the plasma bombardment device is argon plasma.

In other words, the plasma refers to a mixture of argon plasma and oxygen plasma, or oxygen plasma.

In this embodiment, the plasma bombardment device 304 is configured to bombard the first coating material source 301, causing the yttrium atoms and oxygen atoms in the first coating material source 301 to be excited out; and the plasma bombardment device 305 is configured to bombard the second coating material source 302, causing the yttrium atoms and fluorine atoms in the second coating material source 302 to be excited out; the excited yttrium atoms, oxygen atoms, and fluorine atoms collide with one another to react chemically on the surface of the component 303 to form a plasma resistant coating 31, wherein the plasma resistant coating 31 includes a stable phase of yttrium oxyfluoride. When the component 31 is exposed to an oxygen and/or fluorine-contained plasma environment, because the stable phase of yttrium oxyfluoride is formed through chemical reaction, the yttrium oxyfluoride has a stable phase structure, and the yttrium atoms, oxygen atoms, and fluorine atoms are connected via chemical bonds, not like fluorine atoms or oxygen atoms which are simply absorbed to the surface of yttrium oxide or yttrium fluoride, such that when the plasma resistant coating is exposed to plasma environments like fluorine and oxygen, its structural stability is more easily maintained; meanwhile, because the stable phase of yttrium oxyfluoride have a relatively high concentrations of oxygen element and fluorine element (with YOF as an example, the molar atomic percent of F and O reaches as high as 33%), less oxygen and/or fluorine plasma in the plasma environment are adsorbed and diffused by the stable phase of yttrium oxyfluoride, and further corrosion from the oxygen and/or fluorine plasma is reduced, such that on one hand, stability of the plasma resistant coating is maintained; and on the other hand, stability of the fluorine and oxygen plasmas in the etching environment is maintained, and stability of the plasma processing apparatus in etching the wafer is enhanced.

In this embodiment, a material of the stable phase of yttrium oxyfluoride includes at least one of YOF, $Y_5O_4F_7$, $Y_6O_5F_8$, $Y_7O_6F_9$, or $Y_{17}O_{14}F_{23}$.

In one embodiment, the plasma resistant coating 31 only includes a stable phase of yttrium oxyfluoride.

In another embodiment, the plasma resistant coating 31 further includes: an yttrium oxide layer disposed on the surface of the component 303, the stable phase of yttrium oxyfluoride being disposed on the surface of the yttrium oxide layer; and an yttrium fluoride layer disposed on the surface of the stable phase of yttrium oxyfluoride. The surface of the stable phase of yttrium oxyfluoride has an yttrium fluoride layer. The content of fluorine atoms is higher in the yttrium fluoride layer than in the stable phase of yttrium oxyfluoride, which facilitates further reduction of adsorption and diffusion of fluorine on the surface of the plasma resistant coating 31 as well as further fluorine corrosion to the surface of the plasma resistant coating 31, and is thus suitable for a process with a higher F/O ratio in the etching environment, e.g., a manufacturing process for a storage device with a high aspect ratio.

In other embodiment, the plasma resistant coating further includes: an yttrium fluoride layer disposed on the surface of the component, the stable phase of yttrium oxyfluoride being disposed on the surface of the yttrium fluoride layer; and an yttrium fluoride layer on the surface of the stable phase of yttrium oxyfluoride.

When there exists more fluorine plasma in the plasma environment, the outermost layer of the plasma resistant coating is yttrium fluoride; when there exists more oxygen plasma in the plasma environment, the outermost layer of the plasma resistant coating is yttrium oxide.

In other embodiments, the second coating material source is an aluminum-oxygen compound; correspondingly, the formed plasma resistant coating includes a stable phase of yttrium-based multi-element metal oxide which is an yttrium aluminum oxide; or, the second coating material source is zirconium-oxygen compound. Correspondingly, the formed plasma resistant coating includes a stable phase of yttrium-based multi-element metal oxide which is an yttrium zirconium oxide.

Figure 4:
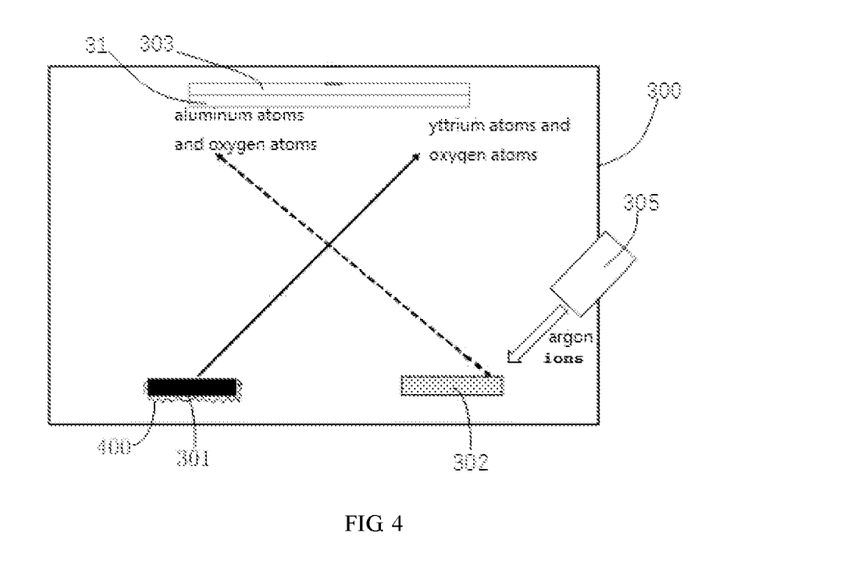
FIG. 4 shows a schematic diagram of another apparatus for forming a plasma resistant coating on a component according to the present disclosure.

FIG. 4 is a structural schematic diagram of a further apparatus for forming a plasma resistant coating on a component according to the present disclosure.

In this embodiment, the first exciting device 400 is a resistance heater; the second exciting device 305 is a plasma bombardment device, wherein the plasma generated by the plasma bombardment device refers to argon plasma.

In other embodiments, the first exciting device 400 is at least one of an electron gun heater, a laser heater, and a radio-frequency induction heater; or, one or more of the combinations of the resistance heater with the electronic gun heater, the laser heater, and the radio-frequency induction heater; and the second exciting device is a plasma bombardment device.

In other embodiments, the first exciting device is a plasma bombardment device; and the second exciting device is at least one of an electronic gun heater, a resistance wire heater, a laser heater, and a radio-frequency induction heater.

In this embodiment, the plasma is a mixture of argon plasma and oxygen plasma, or oxygen plasma.

In this embodiment, the first coating material source 301 is an yttrium oxide, the second coating material source is an aluminum-oxygen compound, the aluminum-oxygen compound being an aluminum-oxygen compound. The resistance heater 401 is configured to heat the first coating material source 301 to excite out the yttrium atoms and the oxygen atoms in the first coating material source 301; the plasma bombardment device 305 is configured to bombard the second coating material source 302, exciting out the aluminum atoms and oxygen atoms in the second coating material source 302; the excited yttrium atoms, oxygen atoms, and aluminum atoms collide with one another to react chemically on the surface of the component 303 to form a plasma resistant coating 31, wherein the plasma resistant coating 31 is an yttrium-based multi-element metal oxide, the yttrium-based multi-element metal oxide being an yttrium aluminum oxide. When the component 31 is exposed to the oxygen and/or fluorine-contained plasma environment, because the yttrium aluminum oxide has a stable structure, the oxygen and/or fluorine in the plasma are not easily adsorbed by the yttrium aluminum oxide, resulting in a relative stable plasma environment, which facilitates improving the plasma's stability in wafer etching.

In other embodiments, the aluminum-oxygen compound includes aluminum hydroxide, boehmite or pseudo bochite.

In other embodiments, the second coating material source is yttrium fluoride; correspondingly, the plasma resistant coating formed on the surface of the component is yttrium-based oxyfluoride, the yttrium-based oxyfluoride being yttrium oxyfluoride; or a material of the second coating material source is an aluminum-oxygen compound or a zirconium-oxygen compound. Correspondingly, the plasma resistant coating formed on the surface of the component is an yttrium-based multi-element metal oxide, the yttrium-based multi-element metal oxide being an yttrium zirconium oxide.

Figure 5:
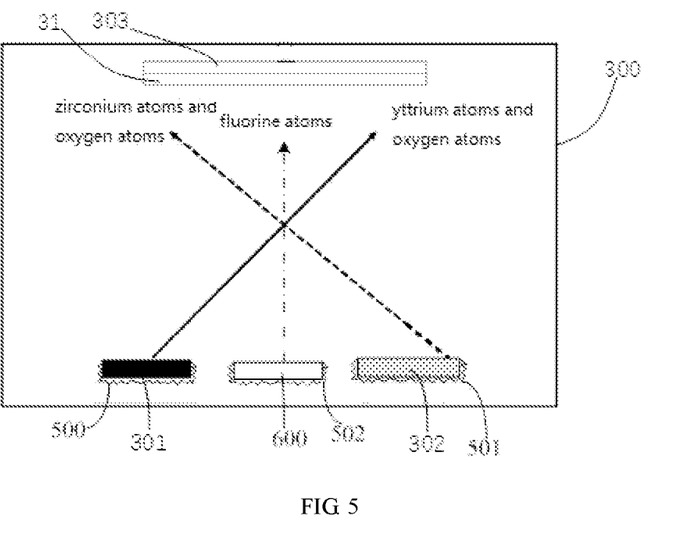
FIG. 5 shows a schematic diagram of a further apparatus for forming a plasma resistant coating on a component according to the present disclosure.

FIG. 5 shows a yet further apparatus for forming a plasma resistant coating on a component according to the present disclosure.

In this embodiment, the first coating material source 301 is yttrium oxide, and the second coating material source 302 is an aluminum oxygen compound or zirconium-oxygen compound; the apparatus for forming a plasma resistant coating further comprises: a third coating material source 600, the third coating material source 600 including a fluorochemical, an aluminum-oxygen compound or a zirconium-oxygen compound, and the material of the third coating material source is different from the material of the second coating material source; a third exciting device 502 configured for exciting out atoms in the third coating material source 600; where the yttrium atoms and oxygen atoms excited out from within the first coating material source 301 and the atoms excited out from within the second coating material source 302 and the third coating material source 600 react chemically to form the yttrium-based oxyfluoride or the yttrium-based multi-element metal oxide, wherein the yttrium-based oxyfluoride includes: yttrium aluminum fluoride oxide or yttrium zirconium fluoride oxide, and the yttrium-based multi-element metal oxide includes yttrium aluminum zirconium oxide.

The first exciting device 500, the second exciting device 501, and the third exciting device 502 are all resistance heaters.

In other embodiments, the first exciting device, the second exciting device, or the third exciting device may be at least one of an electronic gun heater, a laser heater, and a radio-frequency induction heater, or one or more of the combinations of the resistance heater with the electronic gun heater, the laser heater, and the radio-frequency induction heater.

In this embodiment, the resistance heater 500 is configured to heat the first coating material source 301 to excite out the yttrium atoms and oxygen atoms in the first coating material source 301; the resistance heater 501 is configured to heat the second coating material source 302 to excite out the atoms in the second coating material source 302; the resistance heater 502 is configured to heat the third coating material source 600 to excite out the atoms in the third coating material source 600; wherein collision between the yttrium atoms and oxygen atoms excited out from within the first coating material source 301 and the atoms excited out from within the second coating material source 302 and third coating material source 600 produces a chemical reaction on the surface of the component 303 to form a plasma resistant coating 31, wherein the plasma resistant coating 31 includes a stable phase of yttrium oxyfluoride or yttrium-based multi-element metal oxide. When the component 31 is exposed to the oxygen and/or fluorine-contained plasma environment, as the yttrium-based oxyfluoride or the yttrium-based multi-element metal oxide has a stable structure, the oxygen and/or fluorine in the plasma are not easily adsorbed by the yttrium-based oxyfluoride or the yttrium-based multi-element metal oxide such that further corrosion is prevented; meanwhile, the time for the plasma environment in the cavity to reach stability is shortened, which facilitates improving the plasma's stability in wafer etching.

Figure 6:
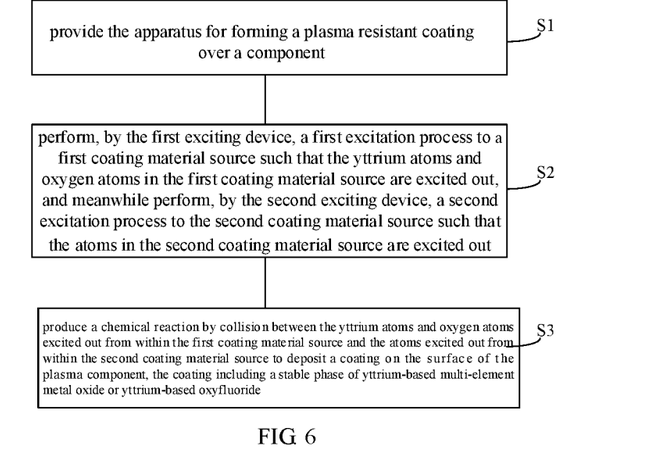
FIG. 6 shows a flow diagram of a process for forming a plasma resistant coating on a component according to the present disclosure.

FIG. 6 shows a flow diagram of a process for forming a plasma resistant coating on a component according to the present disclosure.

FIG. 6 illustrates step S1: providing the apparatus for forming a plasma resistant coating on a component as described above; step S2: performing, using the first exciting device, a first excitation process to the first coating material source such that the yttrium atoms and oxygen atoms in the first coating material source are excited out, and meanwhile performing, using the second exciting device, a second excitation process to the second coating material source such that the atoms in the second coating material source are excited out; Step S3: producing a chemical reaction by collision between the yttrium atoms and oxygen atoms excited out from within the first coating material source and the atoms excited out from within the second coating material source to deposit a plasma resistant coating on the component, the plasma resistant coating including a stable phase of yttrium-based multi-element metal oxide or yttrium-based oxyfluoride.

The first excitation process and the second excitation process refer to one of an ion sputtering process and a high-temperature evaporation process, respectively.

In the case that the first excitation process and/or the second excitation process is the ion sputtering process, the first excitation/exciting device and/or the second exciting device are a plasma bombardment device, and the plasma generated by the plasma bombardment device includes at least one of argon plasma and oxygen plasma.

In the case that the first excitation process and/or the second excitation process is the high-temperature evaporation process, the first exciting device and/or the second exciting device refer to at least one of an electronic gun heater, a resistance wire heater, a laser heater, and a radio-frequency induction heater.

In one embodiment, both the first excitation process and the second excitation process are the ion sputtering process; parameters of the first excitation process include: plasma being argon plasma, and bombardment energy 5 kW~20 kW; parameters of the second excitation process include: plasma being argon plasma, and bombardment energy 5 kW~20 kW.

In another embodiment, both the first excitation process and the second excitation process are the high-temperature evaporation process; parameters of the first excitation process include: temperature higher than 2400° C.; parameters of the second excitation process include: temperature higher than 1400° C.

The underlying principle for the chemical reaction between the yttrium atoms and oxygen atoms excited out of the first coating material source and the atoms excited out of the second coating material source to form yttrium oxyfluoride is that the yttrium atoms, oxygen atoms, metal atoms, and fluorine atoms, which are respectively excited out by ion sputtering or high-temperature evaporation, have a relatively high initial energy (obtained from different excitation manners); these atoms fly freely along a straight line in a high vacuum environment ($<10^{-4}$ Pa, where the average free path of these particles is greater than the flight distance); when energetic particles meet, a massive collusion will occur to facilitate chemical reaction. The formed molecular flow continues flying till impinging the component to deposit on the surface, further forming a plasma resistant coating. When the formed plasma resistant coating is yttrium oxyfluoride, compared with introducing $Y_2O_3$ into $F_2$, the initial energy of yttrium oxygen and yttrium-fluorine particles have a higher initial energy (which are excited to form an atomic/molecular status), and thus particle collision yields a high energy conversion (the relative molecular masses of $Y_2O_3$ and $YF_3$ are 225.8 and 145.9, respectively, far greater than the relative molecular mass 38 of $F_2$ and relative molecular mass 32 of $O_2$, thereby yielding a higher energy exchange upon occurrence of effective collision), which facilitates occurrence of $Y_2O_3+YF_3 \rightarrow YOF$ chemical reaction.

The chemical reaction between the yttrium atoms and oxygen atoms excited out of the first coating material source and the atoms excited out of the second coating material source forms a stable phase of yttrium-based multi-element metal oxide or yttrium-based oxyfluoride. When the component is exposed to the oxygen and/or fluorine-contained plasma environment, because the yttrium-based multi-element metal oxide or the yttrium-based oxyfluoride has a stable phase, the yttrium-based multi-element metal oxide or the yttrium-based oxyfluoride can maintain favorably a structural stability, and the stable phase of yttrium oxyfluoride is not easily adsorbed, diffused or further corroded by the oxygen and/or fluorine in the plasma in the cavity, which maintains a relative stable plasma environment in the cavity and facilitates improving the plasma's stability in wafer etching.

In this embodiment, the method further comprises: heating the component to provide energy to the yttrium atoms and oxygen atoms excited out of the first coating material source and the atoms excited out of the second coating material source, such that chemical reaction occurs more easily between the yttrium atoms and oxygen atoms excited out of the first coating material source and the atoms excited out of the second coating material source, which facilitates deposition to form a stable phase of yttrium-based multi-element metal oxide or yttrium-based oxyfluoride on the component.

In this embodiment, the temperature for heating the component ranges from 25° C. to 500° C.

Figure 7:
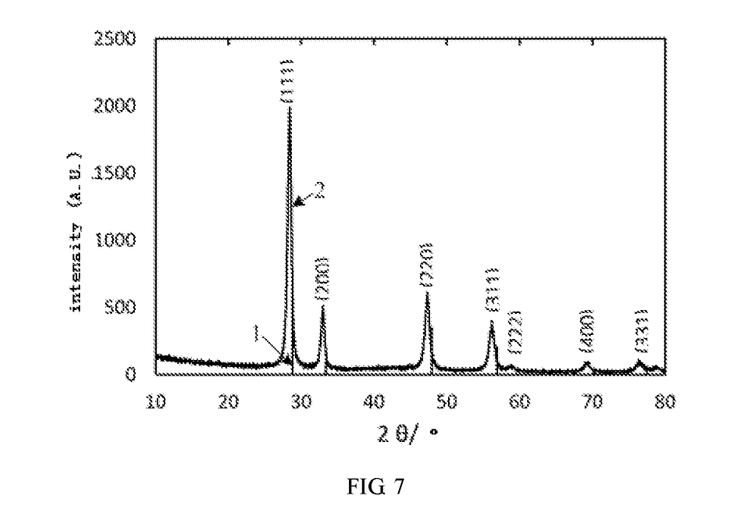
FIG. 7 shows an X-ray diffraction diagram (XRD) of a plasma resistant coating formed according to the present disclosure.

FIG. 7 shows an X-ray diffraction diagram (XRD) of a plasma resistant coating formed according to the present disclosure.

It is noted that 1 denotes the base peak of YOF, and 2 denotes the peak of plasma resistant coating.

Comparison between 1 and 2 shows that the peak 2 of the plasma resistant coating favorably agrees with the base peak 1 of YOF, indicating that the method of forming YOF plasma resistant coating provided by the present disclosure is effective; while the phase corresponding to the YOF base peak of 1 is of a face-centered cubic structure, i.e., the plasma resistant coating is a face-centered cubic structured YOF.

Correspondingly, the present disclosure further provides a component, comprising: a component body, a plasma resistant coating formed on the component body according to the above method, wherein the plasma resistant coating includes a stable phase of yttrium-based multi-element metal oxide or yttrium-based oxyfluoride.

Correspondingly, the present disclosure further provides a plasma processing apparatus, comprising: a reaction chamber, inside which is a plasma environment; a component disposed in the reaction chamber, having a plasma resistant coating, wherein the plasma resistant coating includes a stable phase of yttrium-based multi-element metal oxide or yttrium-based oxyfluoride, the plasma resistant coating being exposed to the plasma environment.

In the case that the plasma processing apparatus is an inductively coupled plasma processing apparatus, the component comprises: at least one of a window, a liner, a nozzle, a gas box, a gas flange, an electrostatic chuck assembly, a cover ring, a focus ring, an insert ring, and a substrate holding fixture.

In the case that the plasma processing apparatus is a capacitively coupled plasma processing apparatus, the component comprises: at least one of a showerhead, an upper ground ring, a moving ring, a gas box, a mountain base, an electrostatic chuck assembly, a lower ground ring, a cover ring, a focus ring, an insert ring, and a substrate holding fixture.

The plasma processing apparatus comprises a reaction chamber, inside which is a plasma environment, the plasma environment including a fluorine plasma and an oxygen plasma, the fluorine plasma and the oxygen plasma being configured for plasma etching processing to the wafer. The plasma resistant coating formed according to the above method includes a stable phase of yttrium-based multi-element metal oxide or yttrium-based oxyfluoride; by exposing the component with the plasma resistant coating to the plasma environment, the adsorption and diffusion of the fluorine ions and/or oxygen ions in the plasma resistant coating are mitigated and the chemical reaction layer depth is reduced, which facilitates shortening the time taken for the cavity etching environment to reach saturation, improving corrosion resistance property and service life of the plasma component, enhancing stability of the plasma environment, further enhancing stability of the etching rate of plasma with respect to the wafer, and further reducing operation and maintenance expenses of the plasma processing apparatus.

Although the present disclosure has been described above, the present disclosure is not limited thereto. Any person skilled in the art may make various changes and modifications without departing from the spirit and scope of the present disclosure; therefore, the protection scope of the present disclosure should accord with the scope defined by the appended claims.

What is claimed is:

1. An apparatus for forming a plasma resistant coating on a component, comprising:
    a vacuum chamber;
    a first coating material source, a second coating material source, and a component, which are disposed in the vacuum chamber; wherein the first coating material source includes oxygen atoms and yttrium atoms, and the second coating material source includes one of yttrium fluoride, aluminum-oxygen compound, or zirconium-oxygen compound; and the component is disposed opposite to the first coating material source and the second coating material source;
    a first exciting device configured for exciting out the yttrium atoms and oxygen atoms from within the first coating material source;
    a second exciting device configured for exciting out atoms from within the second coating material source;
    wherein collision between the yttrium atoms and oxygen atoms excited out of the first coating material source and the atoms excited out of the second coating material source produces a chemical reaction to deposit a plasma resistant coating on the component, the plasma resistant coating including a stable phase of yttrium-based multi-element metal oxide or yttrium-based oxyfluoride;
    wherein the aluminum-oxygen compound includes aluminum oxide, aluminum hydroxide, boehmite or pseudo bochite, the yttrium-based multi-element metal oxide included in the plasma resistant coating is yttrium aluminum oxide, and the yttrium aluminum oxide includes $Y_3Al_5O_{12}$, $YAlO_3$ or $Y_4Al_2O_9$.

2. The apparatus for forming a plasma resistant coating on a component according to claim 1, wherein the first coating material source is $Y_2O_3$, $Y(OH)_3$, or a compound whose decomposed product under high temperature is $Y_2O_3$.

3. The apparatus for forming a plasma resistant coating on a component according to claim 1, wherein the yttrium fluoride is $YF_3$, $Y(CO_3)F$, or a compound whose decomposed product under high temperature is $YF_3$, wherein the yttrium-based oxyfluoride included in the plasma resistant coating is yttrium oxyfluoride; and the stable phase of yttrium oxyfluoride includes at least one of YOF, $Y_5O_4F_7$, $Y_6O_5F_8$, $Y_7O_6F_9$, or $Y_{17}O_{14}F_{23}$.

4. The apparatus for forming a plasma resistant coating on a component according to claim 1, wherein the first exciting device or the second exciting device is a plasma bombardment device, the plasma generated by the plasma bombardment device including at least one of argon plasma and oxygen plasma.

5. The apparatus for forming a plasma resistant coating on a component according to claim 1, wherein the first exciting device or the second exciting device is at least one of an electron gun heater, a resistance heater, a laser heater, and a radio-frequency induction heater.

6. The apparatus for forming a plasma resistant coating on a component according to claim 1, wherein the plasma resistant coating only includes a stable phase of yttrium-based multi-element metal oxide or yttrium-based oxyfluoride.

7. The apparatus for forming a plasma resistant coating on a component according to claim 1, wherein the plasma resistant coating further includes: a metal oxide and/or a metal fluoride.

* * * * *